United States Patent
Wan

(10) Patent No.: US 7,046,117 B2
(45) Date of Patent: May 16, 2006

(54) INTEGRATED MAGNETIC FIELD STRAP FOR SIGNAL ISOLATOR

(75) Inventor: Hong Wan, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/047,207

(22) Filed: Jan. 15, 2002

(65) Prior Publication Data

US 2003/0132826 A1 Jul. 17, 2003

(51) Int. Cl.
*H01L 43/00* (2006.01)

(52) U.S. Cl. .................. 338/32 R; 338/32 H; 252/516

(58) Field of Classification Search ............. 338/32 R, 338/32 H, 34; 324/252; 29/610.1, 610.12; 257/516–518
See application file for complete search history.

(56) References Cited

U.S. PATENT DOCUMENTS

| | | | |
|---|---|---|---|
| 4,441,072 A | 4/1984 | Rahman | |
| 4,504,787 A * | 3/1985 | Planer | 324/142 |
| 4,596,950 A | 6/1986 | Lienhard et al. | |
| 5,247,278 A | 9/1993 | Pant et al. | |
| 5,432,494 A * | 7/1995 | Inoue et al. | 338/32 R |
| 5,500,590 A * | 3/1996 | Pant | 324/252 |
| 5,521,501 A * | 5/1996 | Dettmann et al. | 324/252 |
| 5,686,837 A * | 11/1997 | Coehoorn et al. | 324/252 |
| 5,719,494 A * | 2/1998 | Dettmann et al. | 324/117 R |
| 5,929,636 A * | 7/1999 | Torok et al. | 324/252 |
| 5,952,825 A * | 9/1999 | Wan | 324/252 |
| 5,982,178 A | 11/1999 | Pant et al. | |
| 6,054,780 A | 4/2000 | Haigh et al. | |
| 6,075,361 A * | 6/2000 | Coehoorn et al. | 324/252 |
| 6,252,390 B1 | 6/2001 | Black, Jr. et al. | |
| 6,291,907 B1 * | 9/2001 | Haigh et al. | 307/91 |
| 6,300,617 B1 | 10/2001 | Daughton et al. | |
| 6,529,114 B1 * | 3/2003 | Bohlinger et al. | 338/32 R |

FOREIGN PATENT DOCUMENTS

WO WO 99/61931 12/1999
WO WO 01/50308 A2 7/2001

* cited by examiner

*Primary Examiner*—Tu Hoang
(74) *Attorney, Agent, or Firm*—Schiff Hardin LLP

(57) ABSTRACT

An integrated signal isolator is provided to isolate first and second circuits. First, second, third, and fourth magnetoresistors of the isolator are coupled together so as to form a Wheatstone bridge. The first second, third, and fourth magnetoresistors are arranged so that the Wheatstone bridge is immune to uniform external magnetic fields having any direction. An input strap generates magnetic fields across the first, second, third and fourth magnetoresistors in response to a signal from the first circuit so that the Wheatstone bridge provides an output to the second circuit that is commensurate with the signal from the first circuit.

22 Claims, 3 Drawing Sheets

INTEGRATED MAGNETIC FIELD STRAP FOR SIGNAL ISOLATOR

TECHNICAL FIELD OF THE INVENTION

The present invention relates to a magnetic signal isolator and, more particularly, to a magnetic field strap for an integrated signal isolator.

BACKGROUND OF THE INVENTION

Signal isolators are typically used to isolate lower voltage circuits from relatively higher voltage circuits. For example, it is frequently desirable to isolate a group of sensors being operated in a relatively higher voltage range from processing being operated in a lower voltage range.

Transformers and optical systems have been used as signal isolators. Transformers are usually rather bulky devices when compared with other electronic components associated with integrated circuits. Therefore, transformers are provided externally of the integrated circuits with which they are used.

Optical isolation is usually accomplished by modulating the signal emitted by an optical emitting device, such as a light emitting diode, in accordance with the signal being processed. The emitting device used in such a system is positioned so that the radiation it emits strikes a detector. The output of the detector is then transferred to a processing circuit. In systems that use plural optical isolators, it is difficult, without the use of a complicated assembly, to prevent radiation emitted by one emitter device from striking other detectors located. Therefore, only one such detector, and hence only one optical isolation device, is usually used in a single package. Optical isolation has not been integrated with electronic components.

It is known to integrate a magnetic signal isolator on an integrated circuit. A magnetic signal isolator usually involves a magnetic sensor and a strap. The magnetic sensor may comprise one or more magnetoresistors, and the strap may comprise one or more straps. The strap is coupled to the input of the magnetic isolator and generates a magnetic field in response to an input signal. The magnetic sensor senses this magnetic field and produces an output signal as a function of the magnetic field. Accordingly, the strap receives an input signal from a first circuit operating at a first voltage level, and the magnetic sensor responds to the magnetic field by producing an output signal in a second circuit operating at a second voltage level, which may be either lower or higher than the first voltage level.

The magnetic sensors of known magnetic signal isolators unfortunately sense not only the magnetic field generated by the strap, but also external magnetic fields. As a consequence, these external magnetic fields introduce an error into the output signal of the magnetic sensor. The present invention is directed to strap and magnetic sensor arrangement that is substantially immune to external magnetic fields.

SUMMARY OF THE INVENTION

In accordance with one aspect of the present invention, an integrated signal isolator has first and second ends and comprises first and second isolator input terminals, first and second isolator output terminals, first and second power supply terminals, first, second, third, and fourth magnetoresistors, and an input strap. The first and second magnetoresistors are coupled to the first isolator output terminal, the second and third magnetoresistors are coupled to the first supply terminal, the third and fourth magnetoresistors are coupled to the second isolator output terminal, and the first and fourth magnetoresistors are coupled to the second supply terminal. The input strap has at least one turn coupled between the first and second isolator input terminals. The input strap is disposed with respect to the first, second, third, and fourth magnetoresistors so that a magnetic field is generated over two of the magnetoresistors in one direction, and so that a magnetic field is generated over the other two of the magnetoresistors in an opposite direction.

In accordance with another aspect of the present invention, an integrated signal isolator has first and second ends and comprises first, second, third, and fourth magnetoresistors and an input strap. The first and second magnetoresistors are coupled to a first isolator output terminal, the second and third magnetoresistors are coupled to a first supply terminal, the third and fourth magnetoresistors are coupled to a second isolator output terminal, and the first and fourth magnetoresistors are coupled to a second supply terminal. Each of the first, second, third, and fourth magnetoresistors has a long dimension extending between the first and second ends. The input strap has at least one turn coupled between first and second isolator input terminals. The at least one turn has a first portion running alongside two of the magnetoresistors and a second portion running alongside the other two magnetoresistors, and the at least one turn is arranged so that current supplied to the input strap flows through the first portion in a first direction between the first and second ends and through the second portion in a second direction between the first and second ends. The first and second directions are substantially opposite to one another.

In accordance with still another aspect of the present invention, a method of isolating first and second circuits comprising: generating a first field across at least one magnetically responsive element, wherein the first field is generated in response to an isolator input signal from the first circuit; generating a second field across at least another magnetically responsive element, wherein the second field is generated in response to the isolator input signal from the first circuit, and wherein the first and second fields are substantially opposite to one another in direction; and, supplying an isolator output signal to the second circuit, wherein the isolator output signal is derived across the at least two magnetically responsive elements, and wherein the first and second fields are generated so that the isolator output signal is responsive to the isolator input signal that generates the first and second fields but not to an external field.

In accordance with still another aspect of the present invention, a method of making an integrated signal isolator having first and second ends comprises the following: forming first, second, third, and fourth magnetoresistors in a first layer of an integrated structure so that the first and second magnetoresistors are substantially aligned along a first axis, so that the third and fourth magnetoresistors are substantially aligned along a second axis, and so that the first axis is offset from and parallel to the second axis; coupling the first and second magnetoresistors to a first isolator output terminal; coupling the second and third magnetoresistors to a first supply terminal; coupling the third and fourth magnetoresistors to a second isolator output terminal; coupling the first and fourth magnetoresistors to a second supply terminal; forming an input strap in a second layer of the integrated structure so that the input strap, when receiving an input, generates a field across two of the first, second, third, and fourth magnetoresistors and an opposing field across the other two of the first, second, third, and fourth magnetoresistors; and, coupling the input strap between first and second isolator input terminals.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
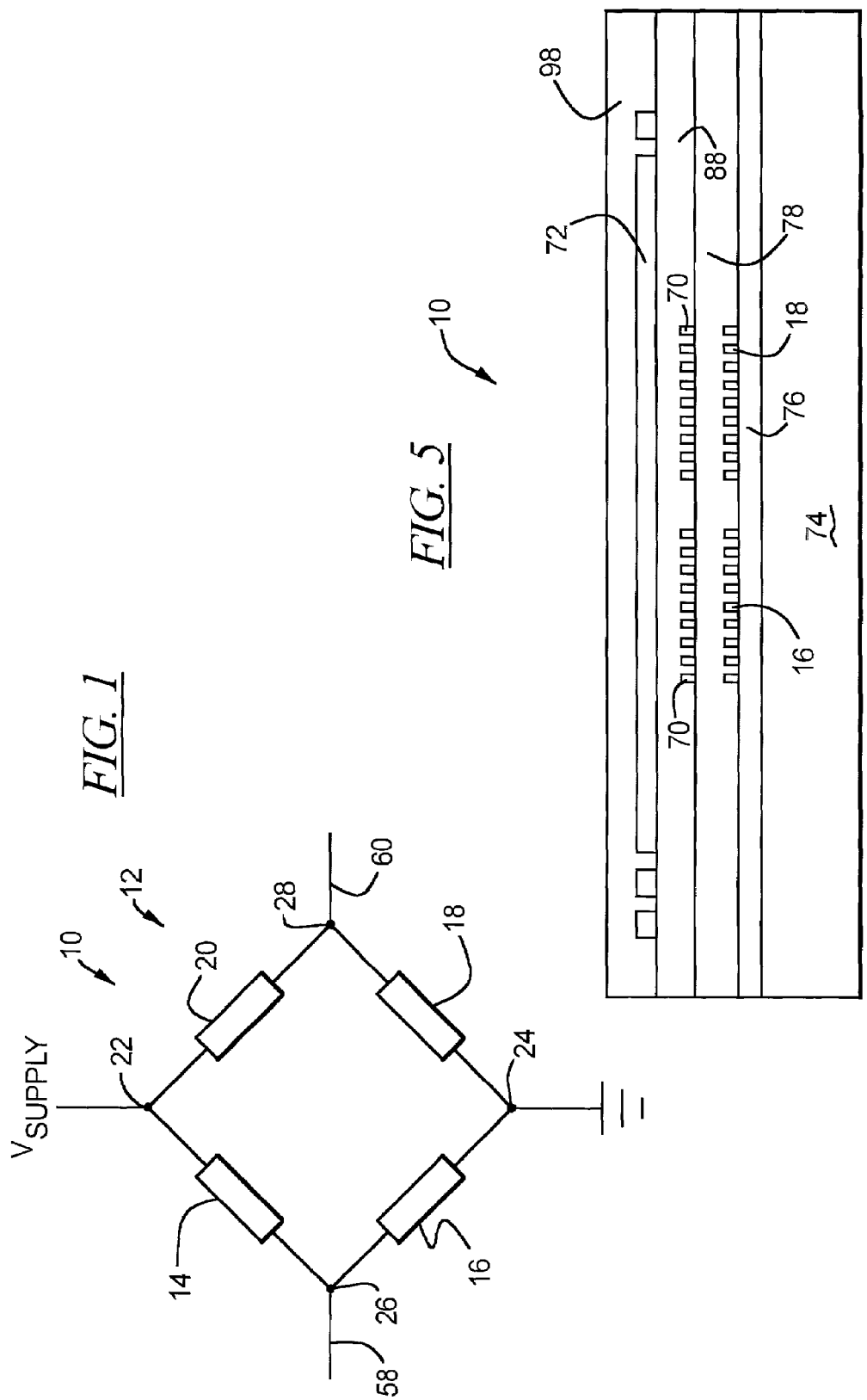
FIG. 1 illustrates an exemplary magnetic sensor that may be used in a magnetic signal isolator.

As shown in FIG. 1, an integrated magnetic signal isolator 10 according to one embodiment of the present invention includes a magnetic sensor 12 having magnetoresistors 14, 16, 18, and 20. Each of the magnetoresistors 14, 16, 18, and 20 may comprise a corresponding thin film of a magnetically responsive material, such as Permalloy or a multilayer GMR film such as Co/Cu/Co. A junction 22 between the magnetoresistors 14 and 20 is coupled to a bridge voltage supply, and a junction 24 between the magnetoresistors 16 and 18 is coupled to a reference, such as ground, of the bridge voltage supply. A junction 26 between the magnetoresistors 14 and 16 and a junction 28 between the magnetoresistors 18 and 20 provide the output of the magnetic sensor 12. As can be seen from FIG. 1, the magnetic sensor 12 is arranged as a Wheatstone bridge.

Figure 2:
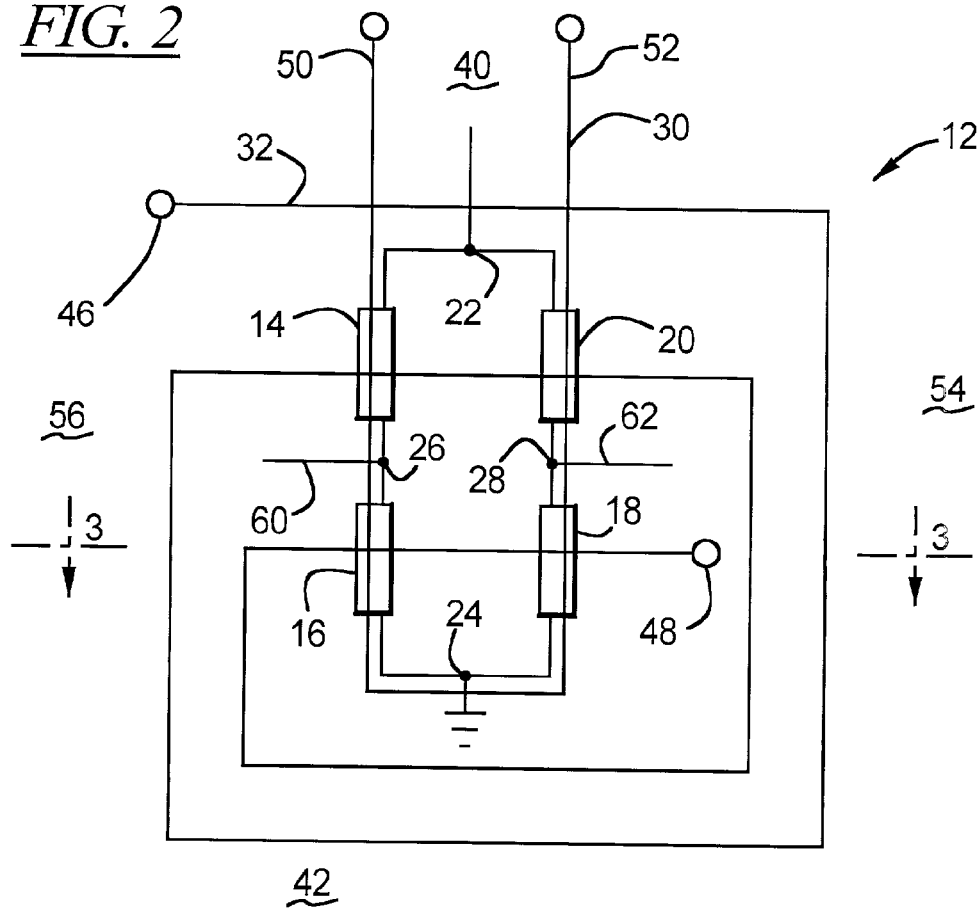
FIG. 2 illustrates an integrated magnetic signal isolator according to one embodiment of the present invention and incorporating the exemplary magnetic sensor illustrated in FIG. 1.
Figure 3:
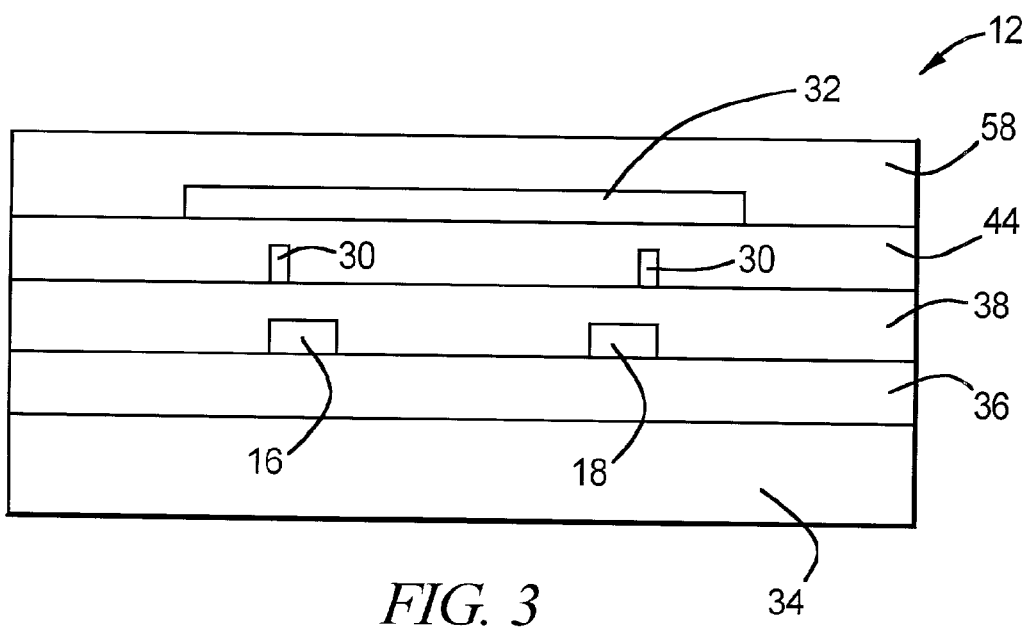
FIG. 3 is a cross section of the integrated magnetic signal isolator taken along line 3—3 of FIG. 2.

As shown in FIGS. 2 and 3, the magnetic sensor 12 is integrated with an input strap 30 and a set-reset coil 32 to form the integrated magnetic signal isolator 10. The integrated magnetic signal isolator 10 includes a semiconductor substrate 34 over which is formed a dielectric layer 36. The magnetoresistors 14, 16, 18, and 20, which may be provided as permalloy thin films having "barber poles" on the tops thereof, or as GMR multiplayer films, are formed over the dielectric layer 36, and a dielectric layer 38 is formed over the magnetoresistors 14, 16, 18, and 20. Each of the dielectric layers 36 and 38 may comprise, for example, silicon dioxide or silicon nitride.

Barber poles are individual conductors that are deposited at an angle across the magnetoresistive material forming the magnetoresistors. These barber poles cause current to flow at an angle through the magnetoresistors. Alternatively, a Barber-pole configuration may include alternating strips of magnetoresistive material (such as permalloy) and conductive material. The dimensions of the strips and the dimensions and orientation of the conductive material may be varied to assist in providing the desired performance characteristics.

The input strap 30 includes at least one turn provided on the dielectric layer 38 above the magnetoresistors 14, 16, 18, and 20. With this arrangement, when the input signal is provided to the input strap 30, current flows through the input strap 30 along the magnetoresistors 14 and 16 from an end 40 to an end 42 of the integrated magnetic signal isolator 10, and current flows through the input strap 30 along the magnetoresistors 18 and 20 from the end 42 to the end 40 of the integrated magnetic signal isolator 10, depending on the polarity of the input signal. Thus, the current flows through the input strap 30 and along the magnetoresistors 14 and 16 in one direction, and current flows through the input strap 30 and along the magnetoresistors 18 and 20 in an opposite direction.

A dielectric layer 44 is formed over the input strap 30, and turns of metal are provided on the dielectric layer 44 so as to form the set-reset coil 32. The dielectric layer 44 may comprise, for example, silicon dioxide or silicon nitride. As shown in FIG. 2, the turns of the reset coil 32 cross the magnetoresistors 14, 16, 18, and 20 perpendicularly. Moreover, the turns of the set-reset coil 32 are wound so that they cross the magnetoresistors 14, 16, 18, and 20 in the same orientation. With this arrangement, when the set-reset coil 32 receives a set-reset current pulse, the current that flows through the set-reset coil 32 above the magnetoresistors 14, 16, 18, and 20 flows in the same orientation. The current could be in an opposite direction for half of the bridge if the barber pole orientation is arranged differently. The set-reset pulse is usually provided before an input is provided to the input strap 30 in order to preset the magnetic moments of the magnetoresistors 14, 16, 18, and 20 in a predetermined direction. This predetermined direction is preferably perpendicular to the fields generated by the input strap 30.

By presetting the magnetic moments of each of the magnetoresistors 14, 16, 18, and 20 in the same predetermined orientation, the output provided by the magnetic sensor 12 in response to an input to the input strap 30 is predictable from measurement to measurement of the output of a circuit or sensor coupled to the input strap 30. Thus, the magnetic moments of each of the magnetoresistors 14, 16, 18, and 20 are consistently preset in the same predetermined orientation prior to each measurement.

If the set-reset pulse is applied to the set-reset coil 32 such that current enters terminal 46 and exits terminal 48, a magnetic field is generated having a direction that points from the end 40 to the end 42. If the input signal is applied to the input strap 30 such that current enters terminal 50 and exits terminal 52, a magnetic field is generated across the magnetoresistors 18 and 20 having a direction that points toward a side 54 of the integrated magnetic signal isolator 10. On the other hand, this same current generates a magnetic field across the magnetoresistors 14 and 16 having a direction that points toward a side 56 of the integrated magnetic signal isolator A dielectric layer 58 is formed over the set-reset coil 32. The dielectric layer 58 may comprise, for example, silicon dioxide or silicon nitride.

With the integrated magnetic signal isolator 10 shown in FIGS. 1–3, a uniform external magnetic field of any direction does not contribute to the output differential across output terminals 60 and 62 coupled to the junctions 26 and 28, respectively, because the voltages across the magnetoresistors 14 and 20 produced by the external magnetic field track one another as do the voltages across the magnetoresistors 16 and 18. Therefore, any change in the external magnetic field produces voltage changes at the junctions 26 and 28 that are equal in magnitude and sign.

However, when an input current is applied to the input strap 30, this current generates a magnetic field across the magnetoresistors 14 and 16 that is opposite in direction to the magnetic field generated across the magnetoresistors 18 and 20. These oppositely oriented magnetic fields produce a differential output across the junctions 26 and 28.

Accordingly, a magnetic signal isolator is provided that has an integrated input strap and magnetic sensor and that produces an output that is substantially immune from a uniform external magnetic field of any direction.

Figure 4:
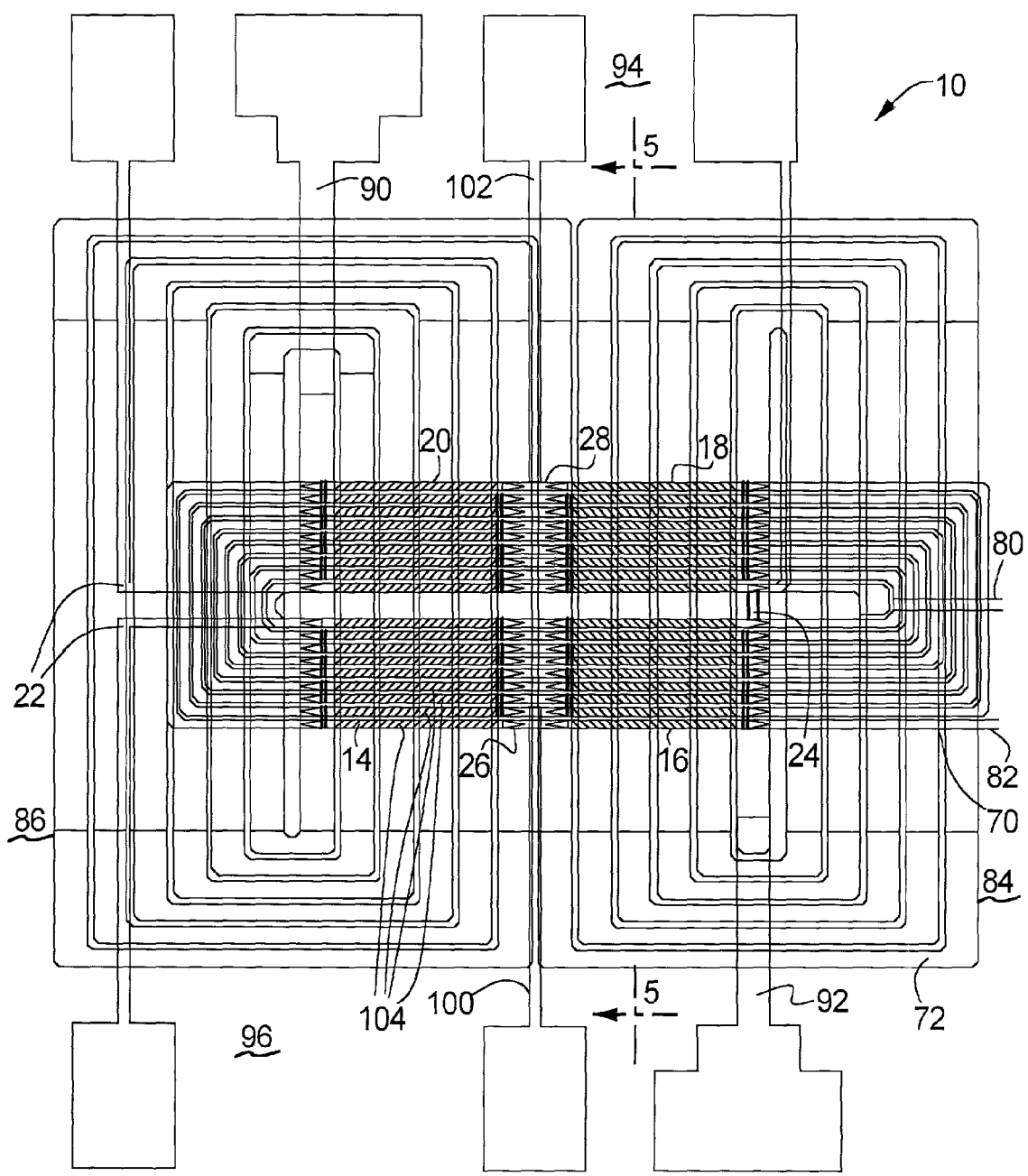
FIG. 4 illustrates an integrated magnetic signal isolator according to another embodiment of the present invention and incorporating the exemplary magnetic sensor illustrated in FIG. 1; and, FIG. 5 is a cross section of the integrated magnetic signal isolator taken along line 5—5 of FIG. 4.

According to the embodiment shown in FIGS. 4 and 5, the magnetic sensor 12 is integrated with an input strap 70 and a set-reset coil 72 to form the integrated magnetic signal isolator 10. The integrated magnetic signal isolator 10 includes a semiconductor substrate 74 over which is formed a dielectric layer 76. The magnetoresistors 14, 16, 18, and 20, which may be provided as permalloy thin films having "barber poles" on the tops thereof, or as GMR multiplayer films, as described above, are formed over the dielectric layer 76, and a dielectric layer 78 is formed over the magnetoresistors 14, 16, 18, and 20.

The input strap 70 comprises a plurality of turns of metal on the dielectric layer 78. As shown in FIG. 4, the elongated portions of the turns of the input strap 70 run parallel to the elongated portions of the magnetoresistors 14, 16, 18, and 20. Moreover, the elongated portions of the turns of the input strap 70 extend over the dielectric layer 78 and beyond the magnetoresistors 14, 16, 18, and 20. Metal traces 80 and 82 are coupled to respective ends of the input strap 70.

With this arrangement, when the input signal is provided to the metal traces 80 and 82, current flows through the input strap 70 along the magnetoresistors 14 and 16 from an end 84 to an end 86 of the integrated magnetic signal isolator 10, and current flows through the input strap 70 along the magnetoresistors 18 and 20 from the end 86 to the end 84 of the integrated magnetic signal isolator 10, depending on the polarity of the input signal. Thus, the current flows through the input strap 70 and along the magnetoresistors 14 and 16 in one direction, and current flows through the input strap 70 and along the magnetoresistors 18 and 20 in an opposite direction.

A dielectric layer 88 is formed over the input strap 70, and turns of metal are provided on the dielectric layer 88 so as to form the set-reset coil 72. As shown in FIG. 4, the elongated portions of the turns of the reset coil 72 run perpendicularly to the elongated portions of the magnetoresistors 14, 16, 18, and 20. Moreover, the elongated portions of the turns of the set-reset coil 72 extend over the dielectric layer 88 and beyond the magnetoresistors 14, 16, 18, and 20. Furthermore, the turns of the set-reset coil 72 that are over the magnetoresistors 14 and 20 are wound in a clockwise direction, and the turns of the set-reset coil 72 that are over the magnetoresistors 16 and 18 are wound in a counter-clockwise direction, assuming current enters the set-reset coil 72 through a metal trace 90 and exits the set-reset coil 72 through a metal trace 92. The metal traces 90 and 92 are coupled to respective ends of the set-reset coil 72.

With this arrangement, when the metal traces 90 and 92 of the set-reset coil 72 receive a set-reset input, the current that flows through the portion of the set-reset coil 72 above the magnetoresistors 16 and 18 flows in a direction from the magnetoresistor 16 to the magnetoresistor 18, and the current that flows through the portion of the set-reset coil 72 above the magnetoresistors 14 and 20 flows in a direction from the magnetoresistor 14 to the magnetoresistor 20, depending on the polarity of the set-reset pulse.

If the set-reset pulse is applied to the metal traces 90 and 92 such that current enters the set-reset coil 72 at the metal trace 90 and exits the set-reset coil 72 at the metal trace 92, a magnetic field is generated having a direction that points from the end 86 to the end 84. If the input signal is applied to the metal traces 80 and 82 such that current enters the input strap 70 at the metal trace 80 and exits the input strap 70 at the metal trace 82, a magnetic field is generated across the magnetoresistors 18 and 20 having a direction that points toward a side 96 of the integrated magnetic signal isolator 10. On the other hand, this same current generates a magnetic field across the magnetoresistors 14 and 16 having a direction that points toward a side 94 of the integrated magnetic signal isolator 10.

A dielectric layer 98 is formed over the set-reset coil 72.

With the integrated magnetic signal isolator 10 shown in FIGS. 1, 4, and 5, a uniform external magnetic field of any direction does not contribute to the output differential across metal traces 100 and 102 coupled to the junctions 26 and 28, respectively, because the voltages across the magnetoresistors 14 and 20 produced by the external magnetic field track one another as do the voltages across the magnetoresistors 16 and 18. Therefore, any change in the external magnetic field produces voltage changes at the junctions 26 and 28 that are equal in magnitude and sign.

However, when an input current is applied to the input strap 70, this current generates a magnetic field across the magnetoresistors 14 and 16 that is opposite in direction to the magnetic field generated across the magnetoresistors 18 and 20. These oppositely oriented magnetic fields produce a differential output across the junctions 26 and 28.

Accordingly, a magnetic signal isolator is provided that has an integrated input strap and magnetic sensor and that produces an output that is substantially immune from a uniform external magnetic field of any direction.

As shown in FIG. 4, the magnetoresistor 14 has a plurality of elongated portions 104 coupled end-to-end to form a serpentine structure. The elongated portions 104 of the magnetoresistor 14 are parallel to an axis extending between the ends 84 and 86. Each of the other magnetoresistors 16, 18, and 20 has a similar construction. Moreover, the first and second magnetoresistors 14 and 16 are aligned along a first axis that extends between the ends 84 and 86, and the third and fourth magnetoresistors 18 and 20 are aligned along a second axis that extends between the ends 84 and 86. These first and second axes are parallel to and offset from one another.

Modifications of the present invention will occur to those practicing in the art of the present invention. For example, the magnetic fields that are generated by the input straps 30, 70 across the magnetoresistors 14 and 16 is opposite in direction to the magnetic fields that are generated by the input straps 30, 70 across the magnetoresistors 18 and 20. However, opposing fields could be applied to any combination of the magnetoresistors 14, 16, 18, and 20 by suitable re-arrangement of the input straps 30, 70 and the set/reset coil. Thus, the magnetic fields that are generated by the input straps 30, 70 across the magnetoresistors 14 and 18 may be opposite in direction to the magnetic field that are generated by the input straps 30, 70 across the magnetoresistors 16 and 20, or the magnetic fields that are generated by the input straps 30, 70 across the magnetoresistors 14 and 20 may be opposite in direction to the magnetic fields that are generated by the input straps 30, 70 across the magnetoresistors 16 and 18. By suitable altering the barber poles orientation and the set/reset direction in the AMR film and altering the pinning layer and free layer magnetization directions in the GMR films in the magnetoresistors 14, 16, 18, and 20, the output across the junctions 26 and 28 will track the current through the input strap 30. Accordingly, the configuration of the barber poles orientation in the AMR films relative to the set/reset direction and configuration of the input strap/ magnetoresistor relationship must be such that the change in resistance of the magnetoresistor 14 tracks the change in resistance of the magnetoresistor 18, and such that the change in resistance of the magnetoresistor 16 tracks the change in resistance of the magnetoresistor 20.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. An integrated signal isolator having first and second ends, wherein the integrated signal isolator comprises:
   first and second isolator input terminals to receive a signal to be isolated;
   first and second isolator output terminals to provide an isolated output signal;
   first and second power supply terminals;
   first, second, third, and fourth magnetoresistors, wherein the first and second magnetoresistors are coupled in series from the first power supply terminal to the second power supply terminal and are longitudinally displace from one another, wherein the third and fourth magnetoresistors are coupled in series from the second power supply terminal to the first power supply terminal and are longitudinally displace from one another, wherein the first isolator output terminal is coupled to a junction between the first and second magnetoresistors, wherein the second isolator output terminal is coupled to a junction between the third and fourth magnetoresistors, and wherein the first and second power supply terminals cause a current to flow in a direction though the first, second, third, and fourth magnetoresistors; and,
   an input strap having at least one turn coupled between the first and second isolator input terminals, wherein the input strap has a first portion disposed adjacent to the first magnetoresistor and in closer proximity to the first magnetoresistor than to the second, third, and fourth magnetoresistors, a second portion disposed adjacent to the second magnetoresistor and in closer proximity to the second magnetoresistor than to the first, third, and fourth magnetoresistors, a third portion disposed adjacent to the third magnetoresistor and in closer proximity to the third magnetoresistor than to the first, second, and fourth magnetoresistors, and a fourth portion disposed adjacent to the fourth magnetoresistor and in closer proximity to the fourth magnetoresistor than to the first, second and third magnetoresistors so that a magnetic field is generated over the first and second magnetoresistors in one direction, and so that a magnetic field is generated over the third and fourth magnetoresistors in an opposite direction, wherein the current through the first portion of the input strap flows in a direction parallel to the direction of current flow through the first magnetoresistor, wherein the current through the second portion of the input strap flows in a direction parallel to the direction of current flow through the second magnetoresistors, wherein the current through the third portion of the input strap flows in a direction parallel to the direction of current flow through the third magnetoresistors, and wherein the current through the fourth portion of the input strap flows in a direction parallel to the direction of current flow through the fourth magnetoresistors.

2. The integrated signal isolator of claim 1 wherein the input strap includes a plurality of turns.

3. The integrated signal isolator of claim 2 wherein each of the first, second, third, and fourth magnetoresistors comprises a serpentine structure having a plurality of elongated magnetoresistive portions coupled end-to-end, wherein the elongated portions of the first and second magnetoresistors are in parallel to the first and second portions of the input strap, respectively, wherein the elongated portions of the third and fourth magnetoresistors are in parallel to the third and fourth portions of the input strap, respectively, wherein the first and second portions of the input strap carry current in a direction that is opposite to current carried by the third and fourth portions of the input strap, and wherein the first and second portions of the input strap are parallel to the third and fourth portions of the input strap.

4. The integrated signal isolator of claim 1 wherein each of the first, second, third, and fourth magnetoresistors comprises a serpentine structure having a plurality of elongated magnetoresistive portions coupled end-to-end, wherein the elongated portions of the first and second magnetoresistors are parallel to a the first and second portions of the input strap, respectively, wherein the elongated portions of the third and fourth magnetoresistors are parallel to the third and fourth portions of the input strap, respectively, wherein the first and second portions of the input strap carry current in a direction that is opposite to current carried by the third and fourth portions of the input strap, and wherein the first and second portions of the input strap are parallel to the third and fourth portions of the input strap.

5. The integrated signal isolator of claim 1 wherein the first, second, third, and fourth magnetoresistors are in a first layer, wherein the input strap is in a second layer, and wherein the first and second layers are separate layers.

6. The integrated signal isolator of claim 5 further comprising a dielectric between the input strap and the first, second, third, and fourth magnetoresistors.

7. The integrated signal isolator of claim 6 wherein the dielectric is a first dielectric, wherein the integrated signal isolator further comprises a second dielectric over the input strap, and wherein the first, second, third, and fourth magnetoresistors are formed over a substrate and under the first dielectric.

8. The integrated signal isolator of claim 1 further comprising a set-reset coil having a plurality of clockwise turns and a plurality of counterclockwise turns, wherein the set-reset coil momentarily sets and resets a direction of magnetization of the first, second, third, and fourth magnetoresistors, wherein each clockwise turn of the set-reset coil has a portion running across the first and fourth magnetoresistors, wherein each counterclockwise turn of the set-reset coil has a portion running across the second and third magnetoresistors, and wherein the clockwise and counterclockwise turns are arranged so that current supplied to the set-reset coil flows through the portions of each of the clockwise and counterclockwise turns in the same direction.

9. The integrated signal isolator of claim 1 further comprising a set-reset coil having a plurality of turns disposed with respect to the first, second, third, and fourth magnetoresistors so that the set-reset coil generates a momentary magnetic field across the first, second, third, and fourth magnetoresistors in the same direction.

10. An integrated signal isolator having first and second ends, wherein the integrated signal isolator comprises:
    first, second, third, and fourth magnetoresistors located between the first and second ends, wherein the first and second magnetoresistors are coupled in series from a first power supply terminal to a second power supply terminal and are longitudinally displaced from one another between the first and second ends, wherein the third and fourth magnetoresistors are coupled in series from the second power supply terminal to the first power supply terminal and are longitudinally displaced from one another between the first and second ends, wherein a junction between the third and fourth magnetoresistors is coupled to a first isolator output terminal, wherein a junction between the first and second magnetoresistors is coupled to a second isolator output terminal, and wherein the first and second power supply terminals cause a current to flow in a direction though the first, second, third, and fourth magnetoresistors; and, an input strap having at least one turn coupled between first and second isolator input terminals, wherein the at least one turn has a first portion extending from the first end to the second end and running lengthwise alongside only the first and second magnetoresistors and a second portion extending from the second end to the first end and running lengthwise alongside only the third and fourth magnetoresistors, wherein the at least one turn is arranged so that current supplied to the input strap flows through the first portion in a first direction from the first end to the second end and through the second portion in a second direction from the second end to the first end, wherein the first and second directions are substantially opposite to one another, and wherein the first and second directions of current flowing through the input strap are parallel to the direction of current flow through the first, second, third, and fourth magnetoresistors.

11. The integrated signal isolator of claim 10 wherein the input strap includes a plurality of turns.

12. The integrated signal isolator of claim 10 wherein the first, second, third, and fourth magnetoresistors are in a first layer, wherein the input strap is in a second layer, and wherein the first and second layers are separate layers.

13. The integrated signal isolator of claim 10 further comprising a dielectric between the input strap and the first, second, third, and fourth magnetoresistors.

14. The integrated signal isolator of claim 13 wherein the dielectric is a first dielectric, wherein the integrated signal isolator further comprises a second dielectric over the input strap, and wherein the first, second, third, and fourth magnetoresistors are formed over a substrate and under the input strap.

15. The integrated signal isolator of claim 11 further comprising a set-reset coil having a plurality of clockwise turns and a plurality of counterclockwise turns, wherein the set-reset coil momentarily sets and resets a direction of magnetization of first, second, third, and fourth magnetoresistors, wherein each clockwise turn of the set-reset coil has a portion running across the first and fourth magnetoresistors, wherein each counterclockwise turn of the set-reset coil has a portion running across the second and third magnetoresistors, and wherein the clockwise and counterclockwise turns are arranged so that current supplied to the set-reset coil flows through the portions of each of the clockwise and counterclockwise turns in the same direction.

16. The integrated signal isolator of claim 10 further comprising a set-reset coil having a plurality of turns disposed with respect to the first, second, third, and fourth magnetoresistors so that the set-reset coil generates a momentary magnetic field across the first, second, third, and fourth magnetoresistors in the same direction.

17. The integrated signal isolator of claim 1 wherein the input strap is disposed with respect to the first, second, third, and fourth magnetoresistors so that, when input current flows between the first and second isolator input terminals, a resistance of the first magnetoresistor tracks a resistance of the third magnetoresistor, and a resistance of the second magnetoresistor tracks a resistance of the fourth magnetoresistor.

18. The integrated signal isolator of claim 1 further comprising a set/reset strap positioned to generate a momentary set/reset magnetic field over the magnetoresistors.

19. The integrated signal isolator of claim 18 wherein the set/reset strap perpendicularly crosses a length of the magnetoresistors in the same direction so as to carry current across the magnetoresistors in the same direction.

20. A semiconductor signal isolator having first and second ends, wherein the semiconductor signal isolator comprises:
 first and second isolator input terminals;
 first and second isolator output terminals;
 first and second power supply terminals;
 a semiconductor substrate;
 first, second, third, and fourth magnetoresistors formed in at least one layer over the semiconductor substrate, wherein the first and second magnetoresistors are coupled in series from the first power supply terminal to the second power supply terminal, wherein the third and fourth magnetoresistors are coupled in series from the second power supply terminal to the first power supply terminal, wherein the first isolator output terminal is coupled to a junction between the first and second magnetoresistors, wherein the second isolator output terminal is coupled to a junction between the third and fourth magnetoresistors, and wherein the first and second power supply terminals cause a current to flow in a direction though the first, second, third, and fourth magnetoresistors;
 an input strap formed in at least one layer over the semiconductor substrate, wherein the input strap has at least one turn coupled between the first and second isolator input terminals, wherein the input strap is disposed with respect to the first, second, third, and fourth magnetoresistors so that a magnetic field is generated over the first and second magnetoresistors in one direction, and so that a magnetic field is generated over the third and fourth magnetoresistors in an opposite direction, and wherein current flows through portions of the input strap that are immediately adjacent to the first, second, third, and fourth magnetoresistors in a direction parallel to the direction of current flow through the first, second, third, and fourth magnetoresistors; and,
 a dielectric between the input strap and the first, second, third, and fourth magnetoresistors.

21. An integrated signal isolator having first and second ends, wherein the integrated signal isolator comprises:
 first and second isolator input terminals to receive a signal to be isolated;
 first and second isolator output terminals to provide an isolated output signal;
 first and second power supply terminals;
 first, second, third, and fourth magnetoresistors, wherein the first and second magnetoresistors are coupled in series from the first power supply terminal to the second power supply terminal and are longitudinally displace from one another, wherein the third and fourth magnetoresistors are coupled in series from the second power supply terminal to the first power supply terminal and are longitudinally displace from one another, wherein the first isolator output terminal is coupled to a junction between the first and second magnetoresistors, wherein the second isolator output terminal is coupled to a junction between the third and fourth magnetoresistors, and wherein the first and second power supply terminals cause a current to flow in a direction though the first, second, third, and fourth magnetoresistors; and, an input strap having at least one turn coupled between the first and second isolator input terminals, wherein the input strap has a first portion disposed in relation to the first magnetoresistor so that an axis passing perpendicularly through a plane of the first portion and through a plane of the first magnetoresistor passes through the first portion and the first magnetoresistor, wherein the input strap has a second portion disposed in relation to the second magnetoresistor so that an axis passing perpendicularly through a plane of the second portion and through a plane of the second magnetoresistor passes through the second portion and the second magnetoresistor, wherein the input strap has a third portion disposed in relation to the third magnetoresistor so that an axis passing perpendicularly through a plane of the third portion and through a plane of the third magnetoresistor passes through the third portion and the third magnetoresistor, wherein the input strap has a fourth portion disposed in relation to the fourth magnetoresistor so that an axis passing perpendicularly through a plane of the fourth portion and through a plane of the fourth magnetoresistor passes through the fourth portion and the fourth magnetoresistor, wherein a current through the input strap generates a magnetic field over the first and second magnetoresistors in one direction and generates a magnetic field over the third and fourth magnetoresistors in an opposite direction, wherein the current through the first portion of the input strap flows in a direction parallel to the direction of current flow through the first magnetoresistor, wherein the current through the second portion of the input strap flows in a direction parallel to the direction of current flow through the second magnetoresistor, wherein the current through the third portion of the input strap flows in a direction parallel to the direction of current flow through the third magnetoresistor, and wherein the current through the fourth portion of the input strap flows in a direction parallel to the direction of current flow through the fourth magnetoresistor.

22. An integrated signal isolator having first and second ends, wherein the integrated signal isolator comprises:

first and second isolator input terminals to receive a signal to be isolated;

first and second isolator output terminals to provide an isolated output signal;

first and second power supply terminals;

first, second, third, and fourth magnetoresistors, wherein the first and second magnetoresistors are coupled in series from the first power supply terminal to the second power supply terminal, wherein the third and fourth magnetoresistors are coupled in series from the second power supply terminal to the first power supply terminal, wherein the first isolator output terminal is coupled to a junction between the first and second magnetoresistors, wherein the second isolator output terminal is coupled to a junction between the third and fourth magnetoresistors, and wherein the first and second power supply terminals cause a current to flow in a direction though the first, second, third, and fourth magnetoresistors; and, an input strap having at least one turn coupled between the first and second isolator input terminals, wherein a current through the input strap generates a magnetic field over the first and second magnetoresistors in one direction and generates a magnetic field over the third and fourth magnetoresistors in an opposite direction; and, a set-reset coil having a plurality of turns disposed with respect to the first, second, third, and fourth magnetoresistors so that the set-reset coil generates a momentary magnetic field across the first, second, third, and fourth magnetoresistors in the same direction.

* * * * *